United States Patent
Walker et al.

(10) Patent No.: US 6,818,501 B2
(45) Date of Patent: Nov. 16, 2004

(54) METHOD OF MAKING A SELF-ALIGNED RECESSED CONTAINER CELL CAPACITOR

(75) Inventors: Michael A. Walker, Boise, ID (US); Karl M. Robinson, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/901,917

(22) Filed: Jul. 9, 2001

(65) Prior Publication Data

US 2001/0046751 A1 Nov. 29, 2001

Related U.S. Application Data

(60) Continuation of application No. 09/249,388, filed on Feb. 12, 1999, now Pat. No. 6,258,660, which is a division of application No. 08/940,307, filed on Sep. 30, 1997, now Pat. No. 6,476,435.

(51) Int. Cl.[7] .................. H01L 21/8242; H01L 21/76
(52) U.S. Cl. ................... 438/243; 438/244; 438/386; 438/387; 438/424
(58) Field of Search ................. 438/243, 244, 438/386, 387

(56) References Cited

U.S. PATENT DOCUMENTS

| | | | | |
|---|---|---|---|---|
| 4,843,025 A | * | 6/1989 | Morita ................. 438/388 |
| 4,918,499 A | * | 4/1990 | Matsutani et al. ....... 257/304 |
| 4,999,689 A | | 3/1991 | Iguchi et al. .......... 357/23.6 |
| 5,017,506 A | | 5/1991 | Shen et al. ............. 437/52 |
| 5,064,683 A | * | 11/1991 | Poon et al. ............ 427/569 |
| 5,068,199 A | | 11/1991 | Sandhu ................. 257/303 |
| 5,089,868 A | | 2/1992 | Motonami .............. 257/303 |
| 5,168,366 A | | 12/1992 | Sasaki ................. 257/297 |
| 5,223,730 A | | 6/1993 | Rhodes et al. .......... 257/301 |
| 5,225,698 A | | 7/1993 | Kim et al. ............. 257/303 |
| 5,343,354 A | * | 8/1994 | Lee et al. ............. 361/322 |
| 5,346,845 A | * | 9/1994 | Jun ..................... 438/244 |
| 5,352,913 A | | 10/1994 | Chung et al. ........... 257/301 |
| 5,416,348 A | | 5/1995 | Jeng ................... 257/297 |
| 5,466,628 A | | 11/1995 | Lee et al. .............. 437/60 |
| 5,521,111 A | | 5/1996 | Sato .................... 437/52 |
| 5,550,078 A | | 8/1996 | Sung .................... 437/52 |
| 5,563,433 A | | 10/1996 | Nagata et al. .......... 257/301 |
| 5,665,201 A | | 9/1997 | Sahota ................. 438/693 |
| 5,665,624 A | | 9/1997 | Hong ................... 438/244 |
| 5,753,547 A | | 5/1998 | Ying ................... 438/253 |
| 5,872,045 A | * | 2/1999 | Lou et al. ............. 438/432 |
| 6,114,216 A | * | 9/2000 | Yieh et al. ............ 438/424 |

FOREIGN PATENT DOCUMENTS

| | | | |
|---|---|---|---|
| JP | 64-24453 | 7/1987 | |
| JP | 63-001052 A | * 1/1988 | ......... H01L/27/10 |
| JP | 2-2672 | 8/1990 | |

OTHER PUBLICATIONS

Wolf et al., "Semiconductor Memory Process Integration", Silicon Processing for the VLSI Era—vol. 2: Process Integration, Lattice Press, 1990, p. 602.*

(List continued on next page.)

*Primary Examiner*—Mary Wilczewski
*Assistant Examiner*—Toniae M. Thomas
(74) *Attorney, Agent, or Firm*—Workman Nydegger

(57) ABSTRACT

Methods for fabricating low leakage trenches for Dynamic Random Access Memory (DRAM) cells and the devices formed thereby are disclosed. In one embodiment of the present invention, the method includes etching a container cell in an isolation film that is disposed within a trench. The container cell forms a vertical interface with the semiconductor substrate on one side through the isolation film. Formation of the container cell is self-aligning wherein previously-formed gate stacks act as etch stops for the container cell etch. In this way the container cell size is dependent for proper etch alignment only upon proper previous alignment and spacing of the gate stacks. The method of forming the container cell within an isolation film that is within a trench in the semiconductor substrate prevents cell-bit line shorting where the cell and the bit line are not horizontally adjacent to each other.

23 Claims, 3 Drawing Sheets

OTHER PUBLICATIONS

Wolf et al., "Isolation Technologies for Integrated Circuits", Silicon Processing for the VLSI Era—vol. 2: Process Integration, Lattice Press, 1990, p. 48.*

Wolf et al., "Hot Carrier–Resistant Processing and Device Structures", Silicon Processing for the VLSI Era—vol. 3: The Submicron MOSFET, Lattice Press, 1995, pp. 634–636.*

Wolf, Ph.D., Stanley, Richard N. Tauber, "Thermal Oxidation of Single Crystal silicon," Silicon Processing for the VLSI Era—vol. 1: Process Technology, Lattice Press, 1986, p. 198.*

Wolf, Ph.D., Stanley, Richard N. Tauber, "Chemical Vapor Deposition of Amorphous and Polycrystalline Films," Silicon Processing for the VLSI Era—vol. 1: Process Technology, Lattice Press, 1986, p. 181–182.*

* cited by examiner

METHOD OF MAKING A SELF-ALIGNED RECESSED CONTAINER CELL CAPACITOR

CROSS-REFERENCE TO RELATED APPLICATIONS

This application is a continuation of U.S. patent application Ser. No. 09/249,388, filed on Feb. 12, 1999, now U.S. Pat. No. 6,258,660 B1, which is a divisional of U.S. patent application Ser. No. 8/940,307, filed on Sep. 30, 1997, now U.S. Pat. No. 6.476.435, both of which are incorporated herein by reference.

BACKGROUND OF THE INVENTION

1. The Field of the Invention

The present invention relates generally to a method for making an improved isolation trench for a semiconductor memory device. More particularly, the present invention relates to a method for fabricating a low leakage trench for a Dynamic Random Access Memory (DRAM) cell wherein trench sidewall leakage currents from the bitline contact to the storage node and from the storage node to the substrate are minimized by an isolation oxide film that is disposed within the trench.

2. The Relevant Technology

In the microelectronics industry, a substrate refers to one or more semiconductor layers or structures which includes active or operable portions of semiconductor devices. In the context of this document, the term "semiconductive substrate" is defined to mean any construction comprising semiconductive material, including but not limited to bulk semiconductive material such as a semiconductive wafer, either alone or in assemblies comprising other materials thereon, and semiconductive material layers, either alone or in assemblies comprising other materials. The term substrate refers to any supporting structure including but not limited to the semiconductive substrates described above.

In a capacitor used in VLSI technology, it is desirable to minimize storage cell leakage in order to reduce refresh frequency requirements and to improve storage reliability. It is also desirable to increase storage cell capacity without increasing lateral geometries and without subjecting vertical storage cells to physical destruction during fabrication.

Both stack and trench DRAM cells suffer from sidewall leakage and from node-to-substrate leakage from the bitline contact. Stack DRAM cells suffer from two additional disadvantages that can result in device destruction and shorting. The first additional disadvantage is that the raised topography of the stack subjects it to the risk of being damaged in subsequent processing such as chemical-mechanical planarization (CMP), that exposes the stack. Subsequent processing, such as rapid thermal processing (RTP), can cause unwanted diffusion of dopants. The second additional disadvantage is that the configuration of the stacked capacitor requires a high aspect ratio of contacts used in connecting the stack capacitor, such as the bit line contact corridor. As one example, metal reflow into a high aspect-ratio contact requires a high amount of heat and pressure. There is also the chance of shorting out the bitline contact into the cell plate in the bitline contact corridor because both the cell plate and the bitline contact corridor are in the same horizontal plane and must intersect without making contact.

Processing of stack DRAMs requires a large amount of thermal energy. The DRAM structure is limited in its ability to withstand the thermal energy without diffusing doped elements to an extent that is destructive. This thermal energy limit is referred to as the thermal budget and must be taken into account in DRAM fabrication. Utilizing more than the entire thermal budget translates into dopant diffusion that may exceed structure design and cause device underperformance or failure. Dealing with the thermal budget adds another dimension to processing that correspondingly decreases the processing degrees of freedom.

Given the forgoing, there is a need in the art for a robust DRAM device that has a low profile above a semiconductor substrate and a highcharge storage capacity. There is also a need in the art for a DRAM device with decreased lateral geometries, and minimized charge leakage. There is also a need in the art for a method of fabricating a robust DRAM that fabricates the DRAM with only a fraction of the thermal budget presently required for similar capacity DRAMs and that allows for optional further processing such as metallization with the unused portion of the thermal budget.

BRIEF SUMMARY OF THE INVENTION

The present invention comprises a method of forming a self-aligned recessed container capacitor. The capacitor is self-aligning in its critical container cell dimensions. The capacitor also presents a low profile for a robust device such that it is less susceptible to physical damage. The capacitor of the present invention is preferably a DRAM device that avoids cell plate-bit line contact shorting by placing the cell plate and bit line contact in different horizontal planes. The capacitor of the present invention provides for a large vertical storage node-semiconductor substrate interface that cannot be achieved with horizontal interfaces without significantly increasing the lateral geometries and thus increasing the overall lateral size of the device.

The method of the present invention comprises etching a trench into a semiconductor substrate and depositing an isolation oxide film into the trench. Gate stacks are formed upon and around the trench. The isolation oxide film within the trench is patterned and etched with the aid of the gate stacks which act as self-aligning etch stops for the purpose of forming a container cell. During the etch of the container cell, critical dimensions are maintained in that the width of the container cell will not exceed the spacing between gate stacks.

The semiconductor substrate has a trench and an active area therein, and the semiconductor substrate defines a plane. An isolation film is disposed within the trench and a container cell disposed within the isolation film. The container cell has an edge that exposes an edge of the semiconductor substrate in an exposure that is substantially orthogonal to the plane of the semiconductor substrate. The etch of the container cell therefore exposes a portion of the semiconductor substrate at a vertically oriented edge thereof below and adjacent to one of the gate stacks. Storage node formation is then preferably done by chemical vapor deposition (CVD) of polysilicon. A cell dielectric is then deposited and a cell plate is deposited upon the cell dielectric, preferably by CVD.

These and other objects and features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF THE PREFERRED EMBODIMENTS

Figure 1:
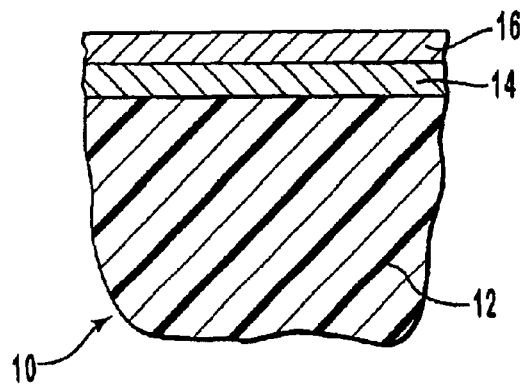
FIG. 1 depicts a nitride/oxide double layer on a semiconductor substrate.
Figure 2:
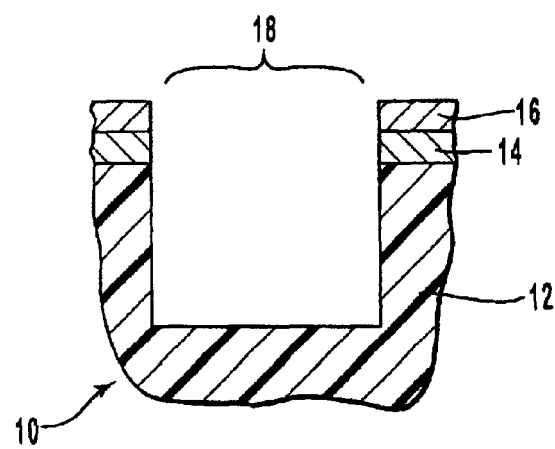
FIG. 2 depicts an isolation trench that has been etched in the semiconductor substrate of FIG. 1.

The present invention comprises a process of forming a container cell in a semiconductor substrate. FIG. 1 illustrates the beginning of the fabrication of the container cell. First an oxide layer 14 is formed upon a semiconductor substrate 12 of the device 10. Oxide layer 14 if present, is preferably $SiO_2$ and is preferably grown thermally. Oxide layer 14 is formed in order to protect semiconductor substrate 12 from contamination. A nitride layer 16, preferably composed of $Si_3N_4$, is formed upon oxide layer 14, thereby forming a nitride/oxide double layer 16, 14 upon semiconductor substrate 12. In order to assure minimized charge leakage by isolating the container cell within an isolating amorphous film, an isolation trench 18 is formed as illustrated in FIG. 2. Isolation trench 18 is patterned and etched through nitride/oxide double layer 16, 14 and into semiconductor substrate 12. Patterning and etching may include spinning on a photoresist, masking, exposing and patterning the photoresist to create a photoresist mask, and anisotropically etching through the photoresist mask.

Figure 3:
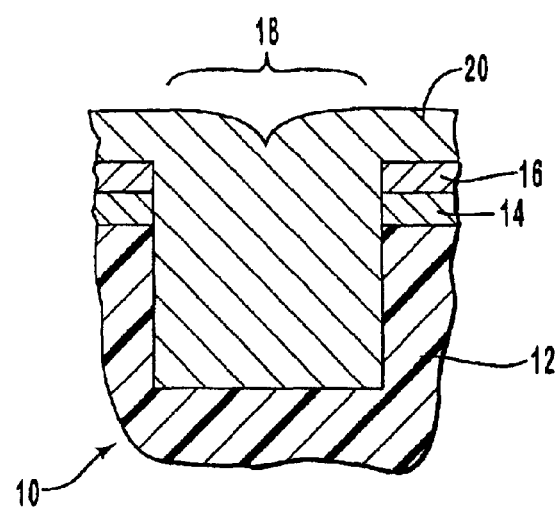
FIGS. 3 and 4 depict an isolation oxide film that has filled the trench of FIG. 2 and has been chemical-mechanically planarized down to the nitride layer, respectively.
Figure 4:
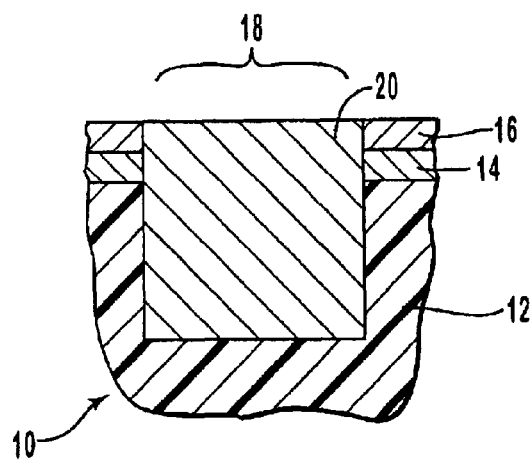

FIG. 3 illustrates the next process step in which a conformal isolation film 20, preferably deposited as a tetra ethy ortho silicate (TEOS) or a boro phospho silicate glass (BPSG) process, is deposited upon nitride/oxide double layer 16, 14 and within isolation trench 18. Conformal isolation film 20 is preferably formed of an insulating material such as silicon dioxide, phosphosilicate glass (PSG), BPSG, thallium oxide, polyimide, etc. Most preferably, conformal isolation film 20 is formed of silicon dioxide that is deposited with a TEOS process. FIG. 4 illustrates the removal of excess isolation film 20 from above nitride/oxide double layer 16, 14. The excess of isolation film 20 is preferably removed by a planarizing technique such as mechanical planarization or abrasion of device 10. An example thereof is chemical-mechanical planarization (CMP) using nitride layer 16 as a CMP stop.

Figure 5:
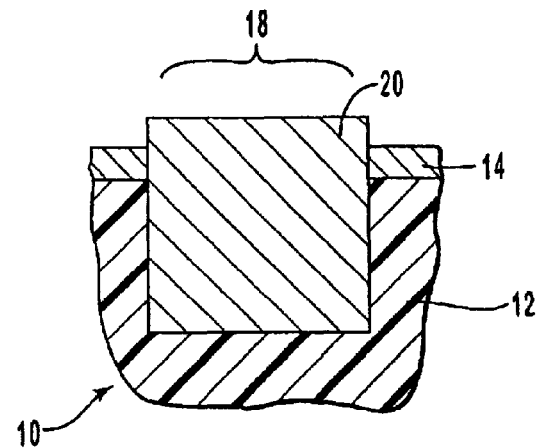
FIG. 5 depicts the results of a nitride strip on the structure surface of FIG. 4.

After conducting the CMP, conformal isolation film 20 remains only in isolation trench 18, such that conformal isolation film 20 fills isolation trench 18 to a level that is flush with the upper surface of nitride layer 16. A hot phosphoric acid bath or equivalent is preferably used to remove nitride layer 16 as illustrated in FIG. 5. Because of a high amount of exposure of the original deposited oxide, oxide layer 14 can be significantly damaged at this point in the process and it can be removed by an aqueous HF bath in the concentration range from 2:1 to 300:1. Alternatively, oxide layer 14 and the portion of conformal isolation film that extends above substrate 12 may be removed by a technique such as densification followed by CMP or an equivalent.

Figure 6:
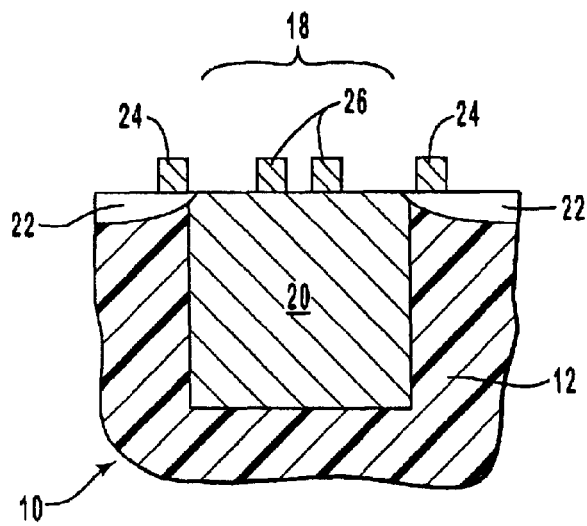
FIG. 6 depicts gate stack construction on the structure of FIG. 5.

With oxide layer 14 and nitride layer 16 removed there remains an intermediate structure that is ready for construction of gate stacks. The gate stacks will assist, upon construction completion, as self-aligning etch stops for the container cell. Gate stacks are formed by various known technologies depending upon the desired device performance requirements. FIG. 6 illustrates only generally the formation of gate stacks wherein a gate oxide 22 has been grown on substrate 12. In the present invention, a first gate stack 24 is formed upon a gate oxide 22 immediately adjacent to the edge of isolation trench 18. Concurrently, a second gate stack 26 is formed upon the upper surface of conformal isolation film 20 within isolation trench 18. First and second gate stacks 24, 26 may be formed simultaneously by forming preferred layers and removing all material therebetween. Removing all material between gate stacks 24, 26 may be done by patterning a mask and etching to isolate gate stacks 24, 26.

Preferably, first and second gate stacks 24, 26 have etch stop qualities relative to conformal isolation film 20. Most preferably, a nitride or $Si_3N_4$ spacer is formed upon gate stacks 24, 26 as an insulator and as the preferred etch stop.

Figure 7:
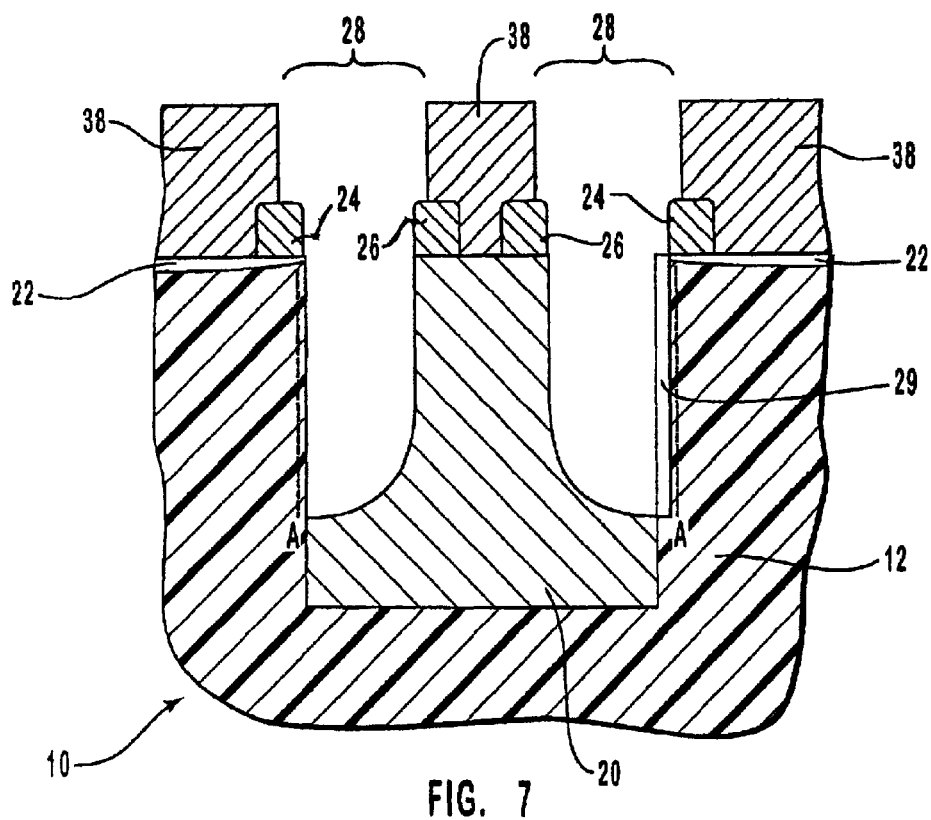
FIG. 7 depicts the results of an anisotropic etch into the structure of FIG. 6 that creates the container cell of the present invention.

Finally, in forming the container cell of the present invention, FIG. 7 illustrates an anisotropic etch that is performed in which the container cell 28 is etched into conformal isolation film 20 as performed through a masking 38. The etch may be preferably a reactive ion etch (RIE).

Semiconductor substrate 12 thus includes trench 18 and active area 22 therein, and semiconductor substrate 12 defines a plane. Isolation film 20 is disposed within the trench 18 and container cell 28 is disposed within isolation film 20. Container cell 28 has an edge that exposes a surface of the semiconductor substrate in an exposure that is substantially orthogonal to the plane of the semiconductor substrate 12 along the line A—A. The etch of container cell 28 therefore exposes a portion of semiconductor substrate 12 at a vertically oriented edge thereof below and adjacent to one of the gate stacks.

Storage node formation is then preferably done by CVD of polysilicon. A cell dielectric is then deposited and a cell plate is deposited upon the cell dielectric, preferably by CVD.

As set forth above, gate stacks 24, 26 act as etch stops. If first gate stack 24 is slightly misaligned, a portion 29 of semiconductor substrate 12 will be etched away in addition to conformal isolation film 20 that is exposed adjacent to first and second gate stacks 24, 26. Although misalignment is not desirable, the present invention achieves an etch of conformal isolation film 20 that exposes at least some portion of semiconductor substrate 12 at a vertically oriented face on one side of etched container cell 28. This partial exposure of semiconductor substrate 12 creates two advantages. The first advantage is that the partial exposure of semiconductor substrate 12 allows for a vertical contact interface with container cell 28 and semiconductor substrate 12 as illustrated along the dashed line A. The etch-stop function of first and second gate stacks 24, 26 assures that this partial exposure will be achieved with the container cell. This vertical contact interface with the semiconductor substrate allows for greater contact area without increasing lateral geometries as would be required in a stack DRAM where the storage node-substrate contact interface is horizontal and usually limited to the footprint size of the storage node on the substrate. The second advantage is that the remainder of container cell 28 is electrically isolated in conformal isolation film 20 and charge leakage is thereby minimized.

Figure 8:
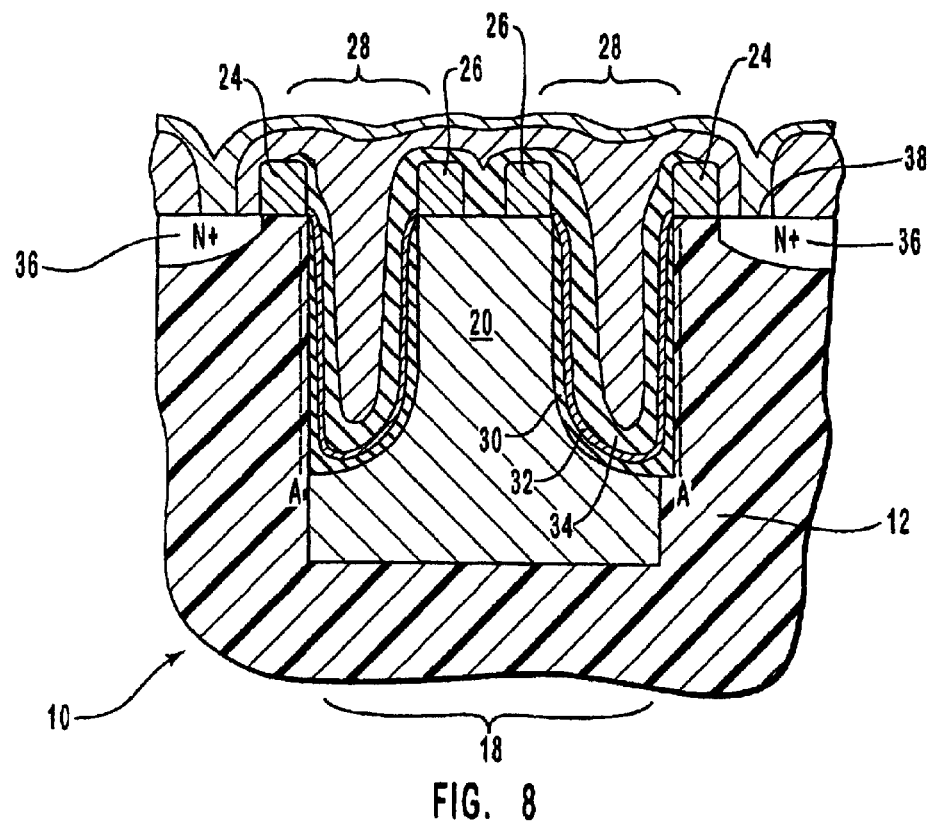
FIG. 8 depicts a completed self-aligned recessed container cell capacitor within the container cell of FIG. 7.

Following the container cell etch, the storage node 30 is deposited as illustrated in FIG. 8. Preferably in-situ-doped CVD polycrystalline silicon is deposited within container cell 28 as the storage node. Electrical conduction or insulation between storage node 30 and the exposed portion of semiconductor substrate 12, illustrated along dashed line A can be controlled by relative doping of the two 12, 30 and by controlling the overall depth of container cell 28. The deeper that container cell 28 penetrates into semiconductor substrate 12, the more that the vertically oriented contact area is exposed between storage node 30 and semiconductor substrate 12 along dashed line A.

The capacitor cell is completed by depositing a cell dielectric 32 upon storage node 30 followed by deposition of a cell plate 34. Cell plate 34 is preferably an in-situ-doped CVD polysilicon, however doping can be achieved by other methods such as directional implantation or vaporization and annealing.

The structure of the present invention is illustrated as a DRAM cell by way of non-limiting example in FIG. 8. Semiconductor substrate 12 has isolation trench 18 and an active area 36 that is preferably N+ doped. Between isolation trench 18 and active area 36, semiconductor substrate 12 supports first gate stack 24. Within isolation trench 18 there is disposed conformal isolation film 20. Conformal isolation film 20 is preferably a heavy TEOS that planarizes easily after deposition. Within conformal isolation film 20 there is disposed container cell 28 that vertically exposes a portion of semiconductor substrate 12 at least tangentially to container cell 28 along dashed line A. Vertical exposure A is below and adjacent to a side edge of first gate stack 24. Second gate stack 26 is disposed upon conformal isolation film 20 adjacent to an edge of container cell 28.

Within container cell 28 there is conformably disposed storage node 30 that contacts conformal isolation film 20 having a cylinder-like shape. Below a side of first gate stack 24, storage node 30 forms a vertical interface with semiconductor substrate 12 along dashed line A. Cell dielectric 32 is substantially conformably disposed on storage node 30. Cell plate 34 is substantially conformably disposed upon first gate stack 24, cell dielectric 32, and second gate stack 26.

It is thus achieved that minimal leakage occurs from storage node 30. This minimal leakage occurs where the entire storage node is isolated. Most of the isolation is due to conformal isolation film 20 that forms container cell 28 for storage node 30. A portion of storage node 30 is not isolated by conformal isolation film 20, along dashed line A. This portion is where storage node 30 vertically interfaces with semiconductor substrate 12. However this vertical interfacing achieves isolation due to the low conductivity in semiconductor substrate 12. A suitable charge can be stored due to the size of storage node 30. The breakdown voltage of the exposed portion of semiconductor substrate 12 is low between storage node 30 and bit line contact 38 due to the large vertical contact interface along dashed line A. Critical dimensions are maintained for the container cell due to the etch-stop quality of materials that are formed as spacers over first and second gate stacks 24, 26.

FIG. 8 also shows that an insulating layer can be formed over cell plate 34 and within container cell 28. The insulating layer is disposed between bit line 38 and cell plate 34.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A process of forming a container cell, comprising:
    forming a trench in a semiconductor substrate, said semiconductor substrate having an upper surface;
    forming an isolation film within said trench;
    forming a gate oxide on the upper surface of said semiconductor substrate such that the gate oxide extends below the upper surface of said semiconductor substrate;
    forming a first gate stack upon said semiconductor substrate and having an edge aligned with and adjacent to an edge of said trench;
    forming a second gate stack upon said isolation film within said trench;
    etching a container cell into said isolation film within said trench, said container cell being situated substantially between said first and second gate stacks and having an edge defined by said semiconductor substrate and said isolation film, said edge of said container cell substantially extending to and terminating at each of said first and second gate stacks;
    forming a storage node within said container cell;
    forming a cell dielectric over said storage node;
    forming a cell plate over said cell dielectric; and
    forming an insulating layer over said cell plate and within said container cell.

2. A process of forming a container cell as defined in claim 1, wherein etching a container cell etches said semiconductor substrate such that a portion of said container cell extends beneath said first gate stack.

3. A process of forming a container cell as defined in claim 1, wherein forming a trench comprises spinning on a photoresist, masking, exposing and patterning said photoresist to create a photoresist mask, and anisotropically etching through said photoresist mask.

4. A process of forming a container cell as defined claim 1, wherein said isolation film is a TEOS film.

5. A process of forming a container cell as defined claim 1, wherein said isolation film is a PSG film.

6. A process of forming a container cell as defined in claim 1, wherein said isolation film is a BPSG film.

7. A process of forming a container cell as defined in claim 1, wherein forming a first gate stack and forming a second gate stack include forming a silicon nitride spacer, respectively, upon said first and said second gate stacks.

8. A process of forming a container cell as defined in claim 1, wherein etching a container cell comprises an RIE process.

9. A process of forming a container cell as defined in claim 1, wherein:
    forming a storage node comprises forming a first polycrystalline silicon layer within said container cell;
    forming a cell dielectric comprises depositing a cell dielectric upon said first polycrystalline silicon layer; and
    forming a cell plate comprises depositing a second polycrystalline silicon layer continuously upon said first gate stack, upon said cell dielectric, and upon said second gate stack.

10. A process of forming a container cell as defined in claim 9, wherein said first polycrystalline silicon layer is formed by an in-situ doping CVD process.

11. A process of forming a container cell as defined in claim 9, wherein said second polycrystalline silicon layer is formed by an in-situ doping CVD process.

12. A process of forming a container cell as defined in claim 1, wherein said isolation film and said semiconductor substrate have an interface below said container cell.

13. A process of forming a container cell as defined in claim 1, wherein said isolation film and said semiconductor substrate have an interface below said container cell, such that said interface is coplanar with said edge defined by said semiconductor substrate and said isolation film.

14. A process of forming a container cell as defined in claim 1, wherein said isolation film and said semiconductor substrate have an interface below said container cell, such that said interface is not coplanar with said edge defined by said semiconductor substrate and said isolation film.

15. A process of forming a container cell, comprising:

forming a trench in a semiconductor substrate, said semiconductor substrate having an upper surface;

forming a conformal isolation film within said trench;

growing a gate oxide on the upper surface of said semiconductor substrate such that the gate oxide extends below the upper surface of said semiconductor substrate;

forming a first gate stack upon said semiconductor substrate and having an edge aligned with and adjacent to an edge of said trench;

forming a second gate stack upon said isolation film within said trench;

etching a container cell into said isolation film within said trench, said container cell being situated substantially between said first and second gate stacks and having an edge defined by said semiconductor substrate and said isolation film, said edge of said container cell substantially extending to and terminating at each of said first and second gate stacks, wherein said semiconductor substrate and said isolation film have an interface that extends below said edge into said semiconductor substrate;

forming a storage node within said container cell;

forming a cell dielectric over said storage node;

forming a cell plate over said cell dielectric; and forming an insulating layer over said cell plate and within said container cell.

16. A process of forming a container cell as defined in claim 15, wherein forming an isolation film is performed by forming an oxide film by the decomposition of TEOS.

17. A process of forming a container cell as defined in claim 15, wherein said container cell is electrically isolated between said isolation film and said semiconductor substrate.

18. A process of forming a container cell as defined in claim 15, wherein etching a container cell comprises an RIE process.

19. A process of forming a container cell, comprising:

forming a trench in a semiconductor substrate by spinning on a photoresist, masking, exposing and patterning said photoresist to create a photoresist mask, and anisotropically etching through said photoresist mask, said semiconductor substrate having an upper surface;

forming a conformal isolation film within said trench by forming an oxide film by deposition;

growing a gate oxide on the upper surface of said semiconductor substrate such that the gate oxide extends below the upper surface of said semiconductor substrate;

forming a first gate stack upon said semiconductor substrate and having an edge aligned with and adjacent to an edge of said trench;

forming a second gate stack upon said isolation film within said trench;

etching a container cell into said isolation film within said trench, said container cell being situated substantially between said first and second gate stacks and having an edge defined by said semiconductor substrate and said isolation film, said edge of said container cell substantially extending to and terminating at each of said first and second gate stacks, wherein said semiconductor substrate and said isolation film form an interface that extends below said container cell into said semiconductor substrate;

forming a storage node within said container cell;

forming a cell dielectric over said storage node;

forming a cell plate over said cell dielectric; and forming an insulating layer over said cell plate and within said container cell.

20. A process of forming a container cell as defined in claim 19, wherein said edge and said interface are coplanar.

21. A process of forming a container cell as defined in claim 19, wherein said edge and said interface are not coplanar.

22. A process of forming a container cell as defined in claim 19, wherein forming a storage node comprises forming a first polycrystalline silicon layer within said container cell;

forming a cell dielectric comprises depositing a cell dielectric upon said first polycrystalline silicon layer; and forming a cell plate comprises depositing a second polycrystalline silicon layer continuously upon said first gate stack, upon said cell dielectric, and upon said second gate stack.

23. A process of forming a capacitor, comprising:

forming a trench in a semiconductor substrate, said semiconductor substrate having an upper surface;

forming an isolation film within said trench;

forming a gate oxide on the upper surface of said semiconductor substrate such that the gate oxide extends below the upper surface of said semiconductor substrate;

forming a first gate stack upon said semiconductor substrate, said first gate stack having an edge aligned with and adjacent to an edge of said trench;

forming a second gate stack upon said isolation film within said trench;

etching a container cell into said isolation film within said trench, said container cell being situated substantially between said first and second gate stacks and having an edge defined by said semiconductor substrate and said isolation film, said edge of said container cell substantially extending to and terminating at each of said first and second gate stacks;

forming a storage node within said container cell;

forming a cell dielectric upon said storage node;

forming a cell plate upon said first gate stack, upon said cell dielectric, and upon said second gate stack; and forming an insulating layer over said cell plate and within said container cell.

* * * * *